United States Patent
Higuchi

(10) Patent No.: US 6,721,005 B1
(45) Date of Patent: Apr. 13, 2004

(54) SOLID STATE IMAGE SENSOR HAVING DIFFERENT STRUCTURES FOR EFFECTIVE PIXEL AREA AND OPTICAL BLACK AREA

(75) Inventor: Toshiaki Higuchi, Kanagawa (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/204,538

(22) Filed: Dec. 3, 1998

(51) Int. Cl.[7] .................. H01L 27/148; H01L 29/768; H01L 27/00; H04N 9/64; H04N 3/14
(52) U.S. Cl. .................. 348/243; 348/275; 348/315; 250/208.1; 257/223; 257/229
(58) Field of Search .................. 348/243, 245, 348/275, 315, 241; 250/208.1, 208.2, 208.3; 257/223, 229, 232

(56) References Cited

U.S. PATENT DOCUMENTS

| | | | | |
|---|---|---|---|---|
| 5,214,272 A | * | 5/1993 | Ueno .................. | 250/208.1 |
| 5,293,237 A | * | 3/1994 | Yonemoto .................. | 348/314 |
| 5,455,624 A | * | 10/1995 | Ishibe et al. .................. | 348/340 |
| 5,519,207 A | * | 5/1996 | Morimoto .................. | 250/208.1 |
| 5,521,639 A | * | 5/1996 | Tomura et al. .................. | 348/243 |
| 5,608,455 A | * | 3/1997 | Oda .................. | 348/295 |
| 6,130,712 A | * | 10/2000 | Miyazaki et al. .................. | 348/243 |
| 6,304,292 B1 | * | 10/2001 | Ide et al. .................. | 348/243 |

FOREIGN PATENT DOCUMENTS

| | | | | | |
|---|---|---|---|---|---|
| JP | 62145771 A | * | 6/1987 | .......... | H01L/27/14 |
| JP | 63142856 A | * | 6/1988 | .......... | H01L/27/14 |
| JP | 06151806 A | * | 5/1994 | .......... | H01L/27/148 |
| JP | 6-181304 | | 6/1994 | | |

* cited by examiner

Primary Examiner—Wendy R. Garber
Assistant Examiner—John M. Villecco
(74) Attorney, Agent, or Firm—Rader, Fishman & Grauer PLLC; Ronald P. Kananen

(57) ABSTRACT

A solid-state image sensor comprising an effective pixel area having light receiving portions which perform photoelectric conversion by taking in light and an optical black area which forms a reference black level without taking in light. The light receiving portions are formed inside electrode opening port portions which are formed through an electrode. Electrode opening port portions in the optical black area which are formed through the electrode are formed narrower than the electrode port portions in the effective pixel area. Alternatively, there may be no opening port portions formed in the optical black area.

4 Claims, 5 Drawing Sheets

SOLID STATE IMAGE SENSOR HAVING DIFFERENT STRUCTURES FOR EFFECTIVE PIXEL AREA AND OPTICAL BLACK AREA

BACKGROUND OF THE INVENTION

The present invention relates to a solid-state image sensor, in particular, it relates to a solid-state image sensor being provided with an effective pixel area which performs photoelectric conversion in taking in rays of light and an optical black area which forms a reference black level.

Examples of a solid-state image sensor includes a CCD (Charge Coupled Device) image sensor, a CMOS image sensor, etc. A CCD image sensor 1 as shown in FIG. 3 is provided with an effective pixel area 2 having a light receiving portion which performs photoelectric conversion by taking in light and an optical black area 3 which forms a reference black level without taking in light.

In the effective pixel area 2, a plurality of effective pixels (not shown in a drawing), each having a light receiving portion, are disposed in vertical and horizontal directions, similarly, in the optical black area 3, a plurality of optical black pixels are disposed in vertical and horizontal directions.

An effective pixel in the effective pixel area 2 is composed of a light receiving portion 11 which performs photoelectric conversion and is formed on the surface layer portion of a silicon substrate 10 as shown in FIG. 5A. A transfer register 13 is formed on one side of the light receiving portion 11 through a read gate 12 and a channel stop 14 is formed on the other side of it. A transfer electrode 16 is formed on the silicon substrate 10 covering a part right above the transfer register 13 through an insulating film 15 and has an opening port in a part right above the light receiving portion 11. The opening port part of the transfer electrode 16 forms an electrode opening port portion 16a having a rectangular shape as shown in FIG. 6.

Further an inter-layer insulating film 17 is formed covering the transfer electrode 16 and a light shielding film 18 made of aluminum (Al) is formed over the inter-layer film 17 on the silicon substrate 10 as shown in FIG. 5A. The light shielding film 18 is provided with an opening port 19 which opens right above part of the light receiving portion 11, that is, in in communication with the electrode opening port 16a. Light is led in through the opening port 19 and the light is input onto the light receiving portion 11. And other light is shielded from coming in.

On the other hand, the optical black pixels in the optical black area 3 have almost the same constitution as that of the effective pixels in the effective pixel area 2. However, they are different from the effective pixels only in that they do not have opening ports 19 in the light shielding film 18 as shown in FIG. 5B (Refer to FIG. 6.). Otherwise, the effective pixels and the optical black pixels have the same construction including the electrode opening port portion 16a not being covered with the transfer electrode 16 and also the transfer register 13, the channel stop 14, etc. being incidental to the transfer electrode 16, which means that the effective pixels and the optical black pixels have the same unit cell size.

The reason why the electrode opening port 16a is also made in the optical black area 3 is that in the total pixel area 4 (FIG. 3) composed of the effective pixel area 2 and the optical black area 3, before the patterning is performed to form the opening port 19 on the shielding film 18, the effective pixel area 2 and the optical black area 3 are not separately processed and they are processed in the same way in order to simplify the manufacturing process. As described in the above, before the patterning of the light shielding film 18 is performed, the effective pixel area 2 and the optical area 3 are processed in the same way. So that when the patterning for forming the transfer electrode 16, is performed the same sized electrode opening port portions 16a are formed in both the effective pixel area 2 and the optical black area 3.

In recent years, solid-state image sensors such as CCD image sensors have been improved in order to respond to the demand for higher sensitivity, higher degree of integration and further miniaturization. However, nowadays, the requests for the miniaturization, etc. exceeds the speed of improvement, and further new improvements are demanded.

In the past, as a technique to respond to the demand for improving the degree of integration, the technique of making the light shielding film thinner was proposed, and is used in a part of actual production. However, it can be considered that the thickness of the film may become so thin that transmission of light sometimes occurs because of the dispersion in manufacturing. In such a case, since the electrode opening port portion 16a and the light receiving portion 11 are also formed in the optical black area 3 in the same way as in the case of the effective pixel area 2, photoelectric conversion may occur in the light receiving portion 11 in the optical black area 3, which may alter the reference black level and cause a malfunction.

SUMMARY OF THE INVENTION

The present invention was invented in consideration of the above-mentioned circumstances, and the object of the present invention is to offer a solid-state image sensor in which higher sensitivity, higher degree of integration and further miniaturization are possible and also the reference black level can be kept in a stable state.

A solid-state image sensor according to the present invention includes an effective pixel area having a light receiving portion which performs photoelectric conversion by taking in light and an optical black area which provides a reference black level without taking in light. The light receiving portion is formed in an electrode opening port portion which is not covered by a transfer electrode. An electrode opening port portion which is not covered by the transfer electrode in the optical black area is formed smaller than that in the effective pixel area as a means to solve the above-mentioned problem.

In the case of a solid-state image sensor of this type, because the electrode opening port portion formed in the optical black area is made smaller than that in the effective pixel area, a unit cell size of the optical black pixels is made smaller than the unit cell size of the effective pixels. Therefore, when the solid-state image sensor of this type is manufactured, theoretical yield of chips obtained from a wafer is increased and the optical black area is narrowed down because of the smaller size of a unit cell. Thus the effective pixel area can be increased corresponding to the narrowed down area in the optical black area, which makes it possible to upgrade the sensitivity and the degree of integration.

Further, since the electrode opening port portion of the optical black area is formed narrow, even when the transmission of light occurs with the tendency of thinning the light shielding film, the quantity of incoming light is small. Therefore, it is possible to control the quantity of photoelectric conversion in the optical black area to be sufficiently.

A solid-state image sensor according to the present invention may also be provided with an effective pixel area having a light receiving portion which performs photoelectric conversion by taking in light and an optical black area which forms a reference black level without taking in light, in which the light receiving portion is formed inside the electrode opening port portion which is not covered with a transfer electrode and an electrode opening port portion which is not covered with the transfer electrode is not formed in the optical black area. This will be a means for solving the above-mentioned problem.

In the case of a solid-state image sensor of this type, because an electrode opening port portion is not formed in the optical black area, a unit cell size of an optical black pixel becomes smaller than that of an effective pixel. Therefore, for example, when a solid-state image sensor of this type is manufactured, the theoretical yield of chips obtained from a wafer is increased and also the area used for the effective pixel area can be increased in proportion to the decreased area of the optical black area due to the down sizing of a unit cell size of an optical black pixel, which makes it possible to obtain a means to upgrade the sensitivity and the degree of integration.

Furthermore, an electrode opening port portion is not formed in the optical black area, accordingly there is no light receiving portion being incidental to the electrode opening port portion, so that even when the transmission of light through a shielding film occurs due to the use of a thin light shielding film, the photoelectric conversion in the optical black area can be completely suppressed.

DESCRIPTION OF THE PREFERRED EMBODIMENTS

Figure 1:
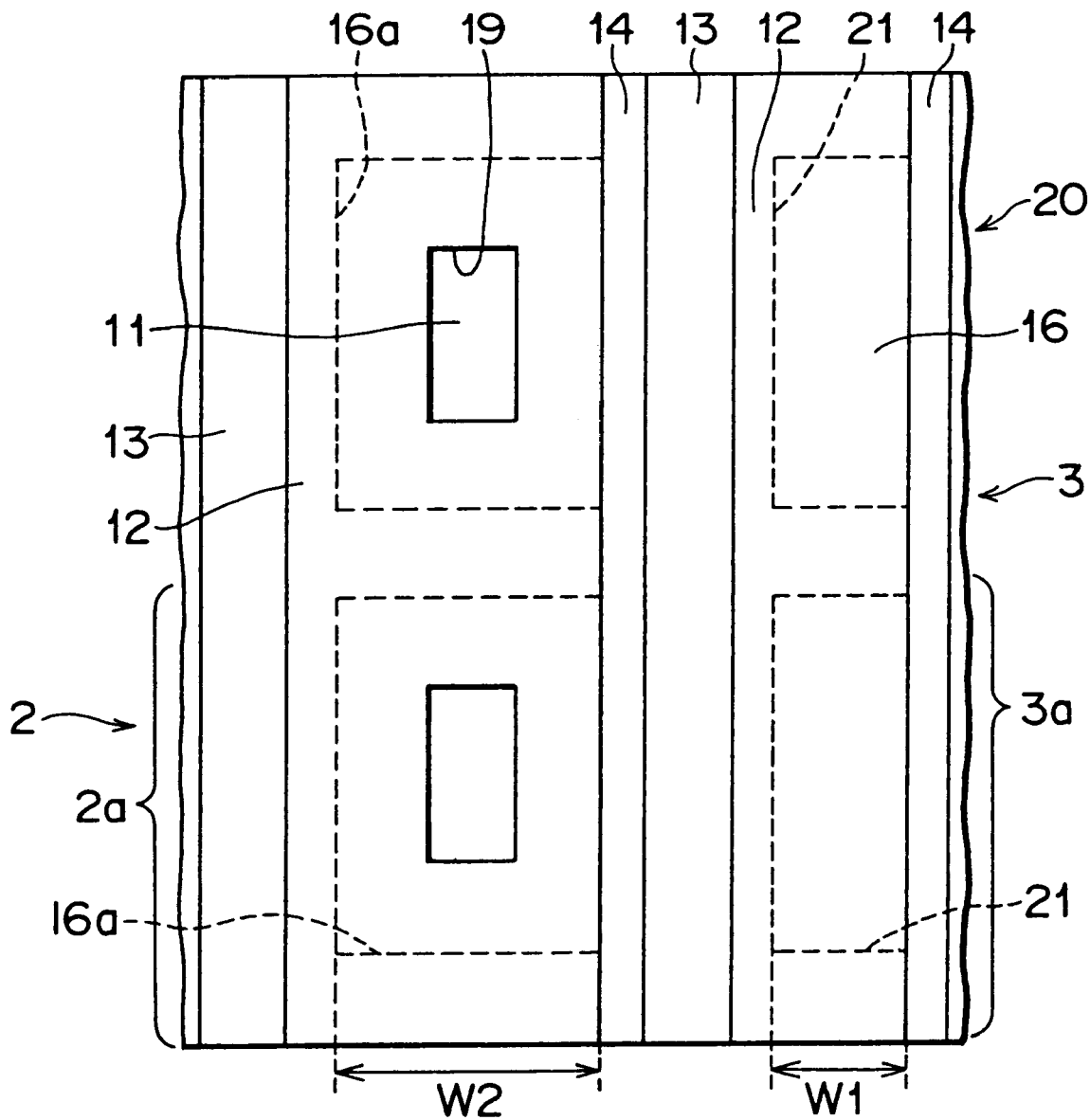
FIG. 1 shows a schematic diagram of a first embodiment in which a solid-state image sensor according to the present invention is applied to a CCD image sensor.
Figure 5A:
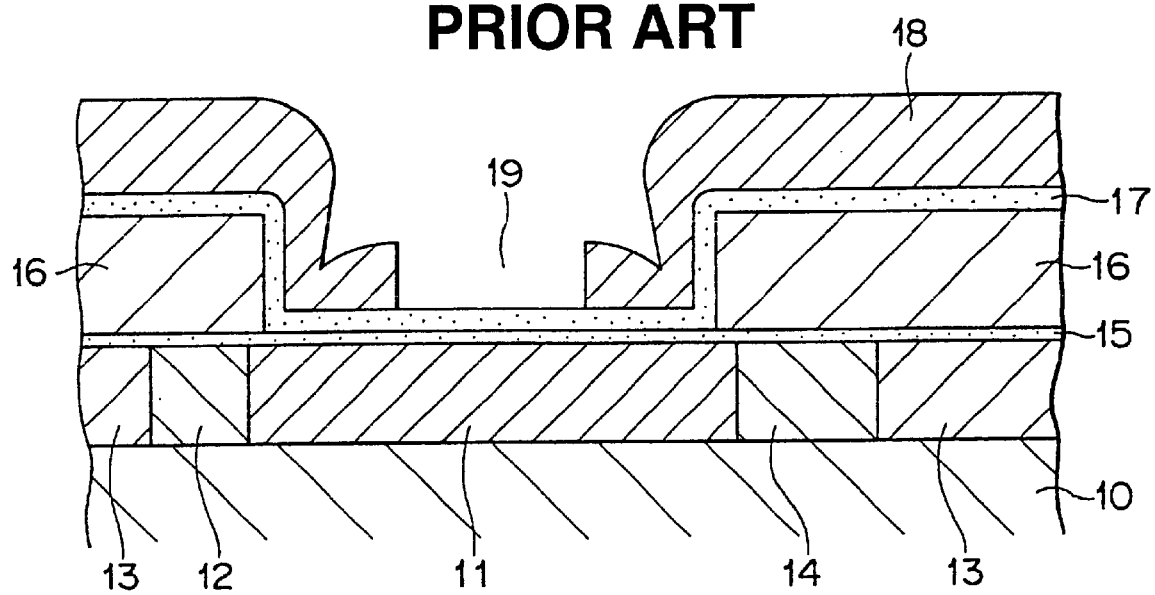
FIG. 5A shows a side sectional view of an effective pixel in a conventional CCD image sensor.
Figure 5B:
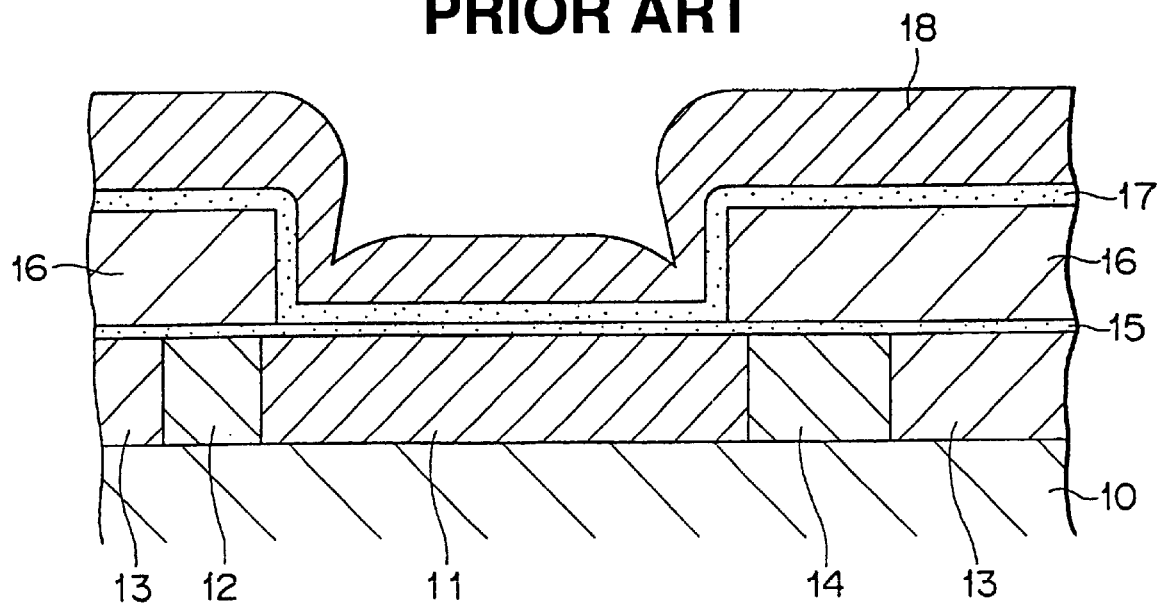
FIG. 5B shows a side sectional view of an optical black pixel in a conventional CCD image sensor.
Figure 6:
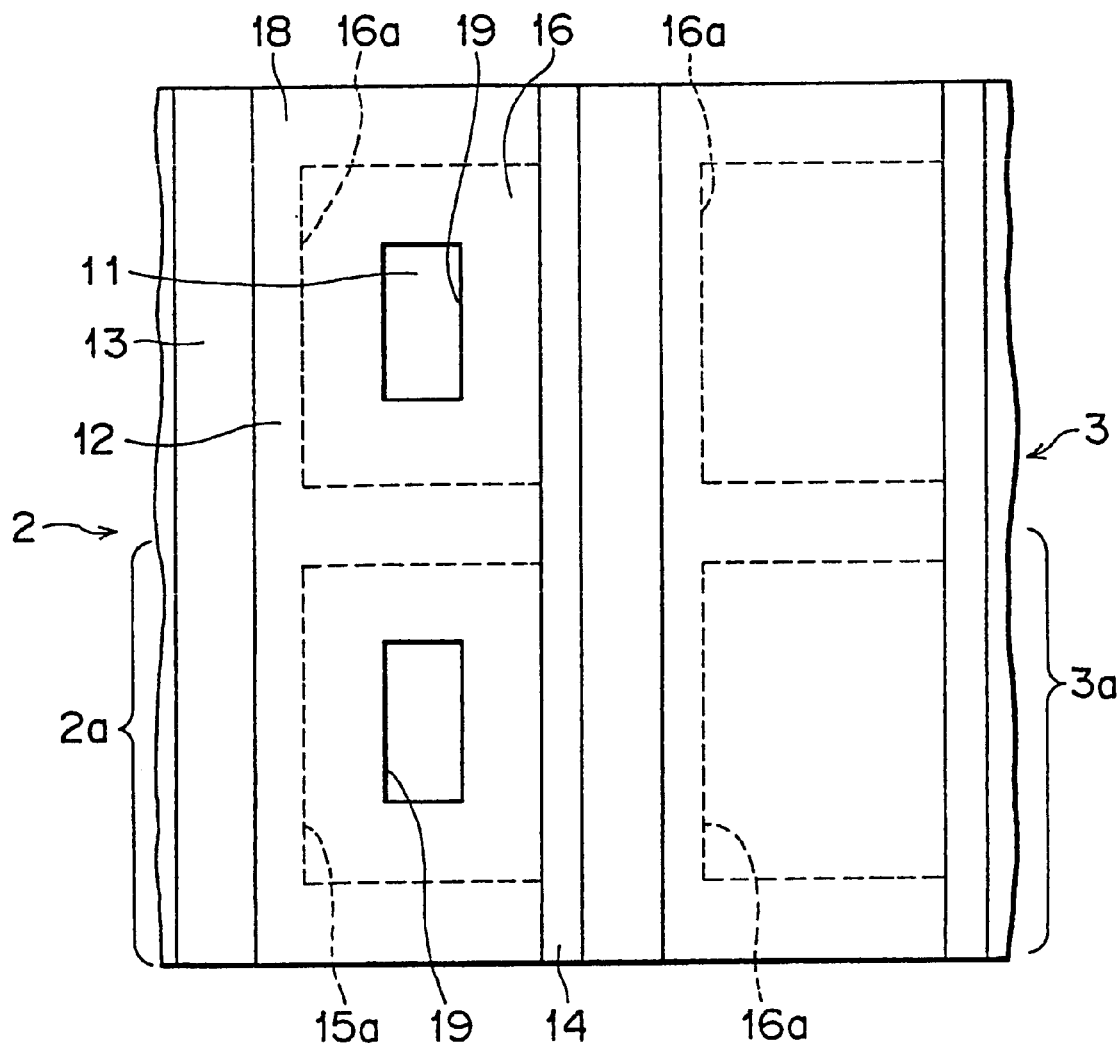
FIG. 6 shows a plan view of a schematic diagram of a conventional CCD image sensor, and an enlarged view of a part indicated by an arrow A in FIG. 3.

FIG. 1 shows the first embodiment according to the present invention. Reference numeral 20 denotes a CCD image sensor. The difference between the CCD image sensor 20 and the CCD sensor 1 shown in FIG. 5 is that the electrode opening port portion 21 in the transfer electrode 16 of the optical black pixel 3a in the optical black area 3 is formed narrower in width than the electrode opening port portion 16a of an effective pixel 2a in the effective pixel area 2. In other words, in this example, the width W1 in the horizontal direction of the electrode opening port portion 21 of the optical black pixel 3a is made narrower than the width W2 of the electrode opening port portion 16a of the effective pixel 2a. In this discussion horizontal direction means a direction which makes a right angle with the transfer direction of a signal charge in the transfer electrode 16 which is assumed to be a vertical direction.

The optical black pixel 3a in the optical black area 3 comprises the same component parts as those of a conventional optical black pixel, that is, the same component parts as those of the effective pixel 2a in the effective pixel area 2, excepting the electrode opening port portion 21. The component parts are as shown below: a light receiving portion 11, a read gate 12, a transfer register 13, a channel stopper 14, and further on the silicon substrate 10, an insulating film 15, a transfer electrode 16, an inter-layer insulating film 17 and a light shielding film 18. Usually, the light receiving portion 11 is formed by implanting ions onto the electrode opening port portion 21, so that the width of the light receiving portion 11 in the horizontal direction becomes narrower in comparison with that of the effective pixel 2a corresponding to the electrode opening port portion 21.

In the manufacture of such a CCD image sensor 20, a conductive material, for example polysilicon, to be a transfer electrode is accumulated with for example the CVD method. Then, the conductive material is patterned with a resist technique, lithography technique or etching technique which are known. The effective pixel area 2 and the optical black area 3 are patterned to be different. Other words, when formed by etching, the width W1 of the electrode opening port portion 21 in the optical black pixel 3a is patterned to be narrower than the width W2 of the electrode opening port portion 16a in the effective pixel 2a.

In a CCD image sensor 20 formed according to the present invention, the electrode opening port portion 21 in the optical black area 3 is formed narrower than the electrode opening port portion 16a in the effective pixel area 2, so that the unit cell size in the horizontal direction of the optical black pixel 3a is made smaller than the unit cell size in the horizontal direction of the effective pixel 2a. Therefore, for example, when the image sensor 20 is manufactured, it is possible to increase the theoretical yield of chips which can be obtained from a wafer, and also the area for the effective pixel area 2 can be increased in proportion to the decreased area of the optical black area 3 due to the decrease in the unit cell size of the optical black pixel 3a, which makes it possible to upgrade the sensitivity and the degree of integration.

Further, the electrode opening port portion 16a in the optical black area 3 is formed being sufficiently narrowed, so that even if the transmission of light through the light shielding film 18 occurs due to the tendency to thin the light shielding film 18. The quantity of light incident onto the light receiving portion 11 which is formed in the electrode opening port portion 16a is also small. Consequently, it is possible to control the quantity of photoelectric conversion performed in the optical black area to be small enough that it is possible to keep the reference black level stable.

Figure 2:
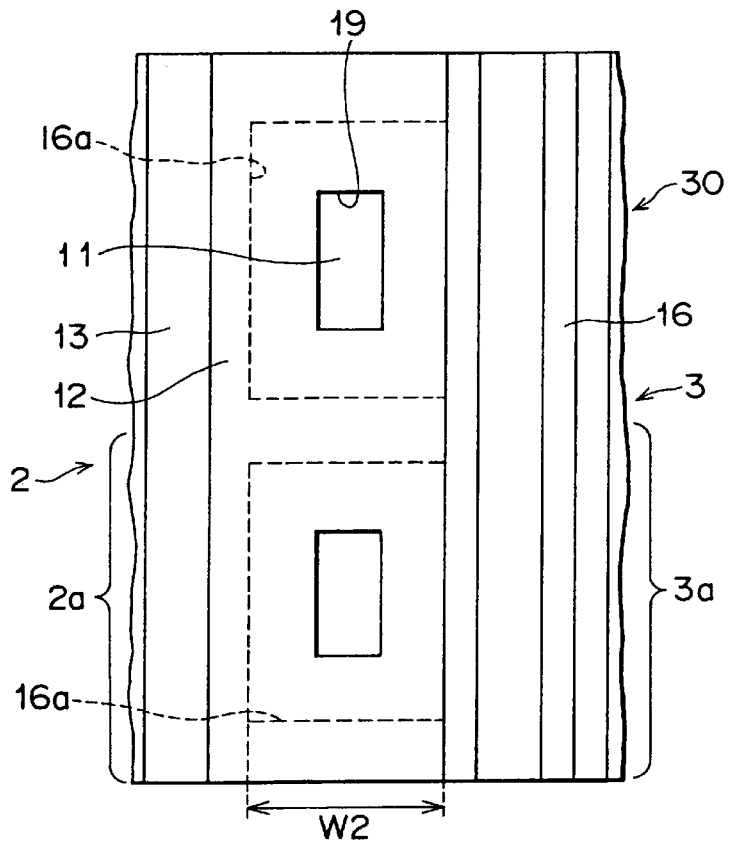
FIG. 2 shows a schematic diagram of a second embodiment in which a solid-state image sensor according to the present invention is applied to a CCD image sensor.
Figure 3:
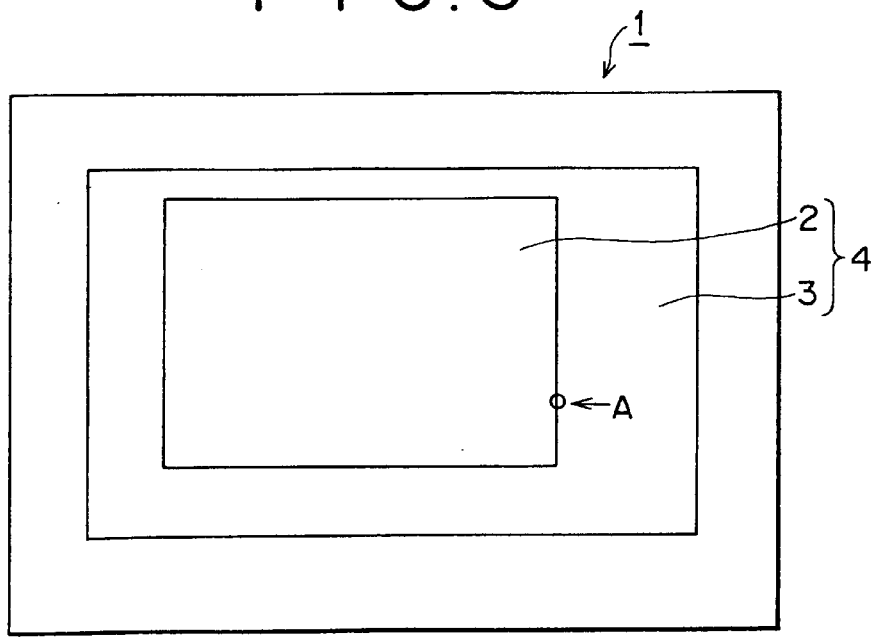
FIG. 3 shows a plan view showing a schematic diagram of a CCD image sensor according to the present invention.

FIG. 2 shows a second embodiment according to the present invention. In the figure, a reference numeral 30 denotes a CCD image sensor. The difference between the CCD image sensor 30 and the CCD image sensor 20 shown in FIG. 1 is that electrode opening port portions are not formed in respective optical black pixels 3a in the optical black area 3. In this example, the electrode opening port portion is not formed in the optical black pixel 3a and, consequently the light receiving portion is not formed either. Excepting the above, the constitution of the optical black pixel 3a is the same as that of a conventional one. That is, the same as that of an effective pixel 2a in the effective pixel area, having the following component parts: a read gate 12, a transfer register 13, a channel stopper 14, and further on the silicon substrate 10 an insulating film 15, a transfer electrode 16, an inter-layer insulating film 17 and a light shielding film 18.

When a CCD image sensor according to the second embodiment is manufactured, a conductive material such as polysilicon, etc. is accumulated by for example CVD method, etc. on a substrate, and it is patterned to form the transfer electrode 16. In this case, the patterning is so performed that an electrode opening port portion 16a is formed in the effective pixel area 2 in the same way as described above. On the other hand, in the optical black area 3, an electrode opening port portion is not formed. The other component parts other than the electrode opening port portion are formed in the optical black area 3 in the same way as in the case of the effective pixel area 2. Therefore, in the CCD image sensor 30 thus obtained, the width in the horizontal direction of the optical black pixel 3a in the optical black area 3 becomes narrower in comparison with the width in the horizontal direction of the effective pixel 2a in the effective pixel area by the width W2 of the electrode opening port portion 16a.

Therefore, in the case of a CCD image sensor 30 thus obtained, the unit cell size of the optical black pixel 3a is made much smaller than the unit cell size of the effective pixel 2a because electrode opening port portion is not formed in the optical black area 3. Therefore, for example, when the image sensor 30 is manufactured, it is possible to increase the theoretical yield of chips to be obtained from a wafer, and also the area for the effective pixel area 2 can be increased in proportion to the decreased area in the optical black area 3, which makes it possible to upgrade the sensitivity and the degree of integration.

Further, an electrode opening port portion is not formed in the optical black area, so that even if the transmission of light through the light shielding film 18 occurs due to the trend of thinning the light shielding film 18, because there is no electrode opening port portion and naturally no light receiving portion which is incidental to the above, the photoelectric conversion in the optical black area can be completely suppressed, which makes it possible to keep the reference black level constant.

Figure 4:
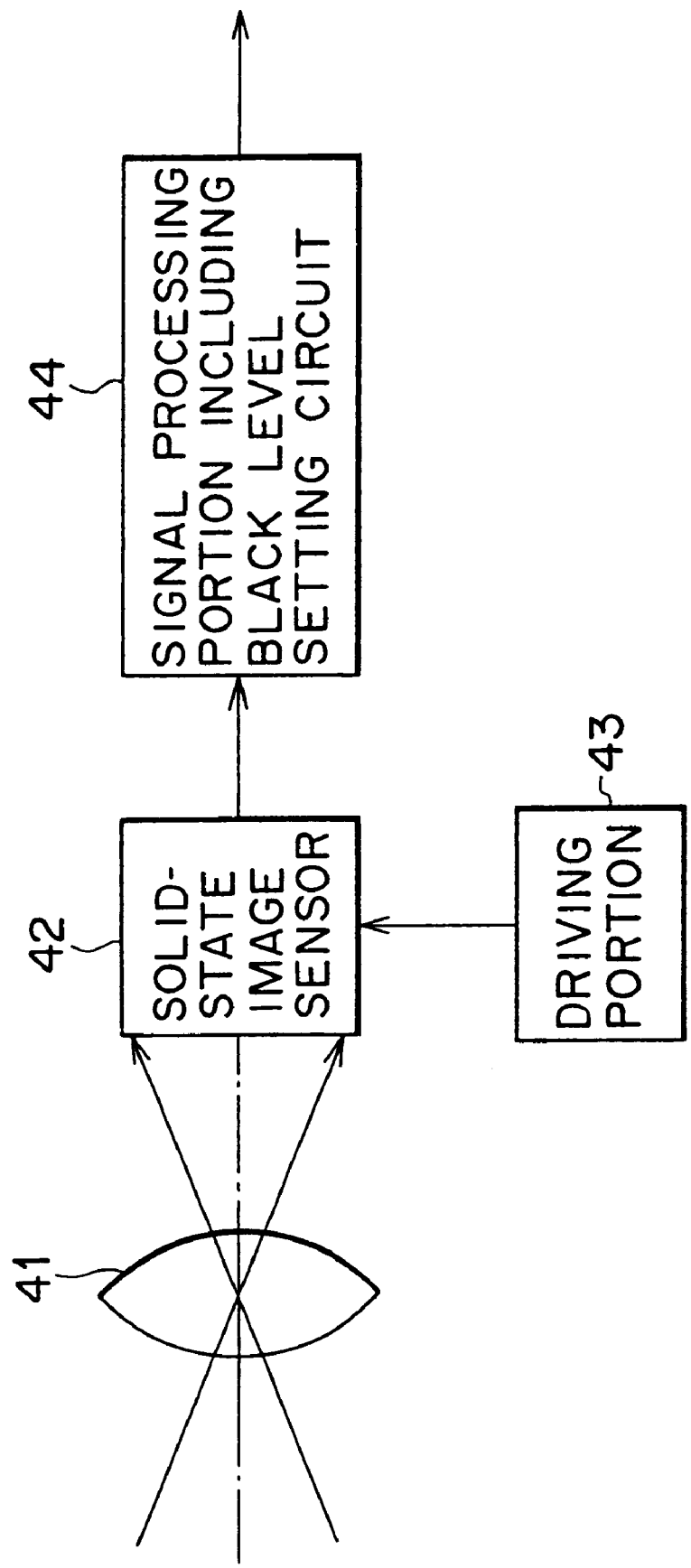
FIG. 4 shows a schematic diagram of a camera using a solid-state image sensor according to the present invention.

FIG. 4 shows a schematic diagram of an example of a camera using a solid-state image sensor having the above-mentioned configuration according to the present invention. In FIG. 4, incident light from a subject is made to form an image on the surface of a solid-state image sensor 42 with an optical system including a lens 41. As for a solid-state image sensor, the one having the above-mentioned configuration is used. The solid-state image sensor 42 is driven based on the driving method as mentioned in the above by a driving portion 43 which includes a timing generator, etc. The output signal of the solid-state image sensor 42 becomes a video signal after various kinds of signal processes are executed on it in a signal processing portion 44. A black level setting circuit which sets a black level using the output from the optical black area of the solid-state image sensor 42 according to the present invention is also contained in the signal processing portion 44.

As explained in the above, in a solid-state image sensor according to the present invention, the electrode port portion formed in the optical black area is made narrower than the electrode port portion in the effective pixel area. Therefore, the unit cell size of an optical black pixel is made smaller than the unit cell size of an effective pixel, so that, for example, when a solid-state image sensor is manufactured, it is possible to increase the theoretical yield of chips to be obtained from a wafer, and also the area for the effective pixel area can be increased in proportion to the decreased optical black area due to the downsizing of the unit cell size of the optical black pixel, which makes it possible to upgrade the sensitivity and the degree of integration.

Further, since the electrode opening port portion in the optical black area is formed narrow, even when the transmission of light through a light shielding film occurs due to the trend of thinning the light shielding film, the quantity of light incident onto the light receiving portion is minimized. Therefore, it is possible to control the quantity of photoelectric conversion to be low enough to keep the reference black level stable.

In a solid-state image sensor according to the present invention, an electrode opening port portion is not formed in the optical black area, so that the unit cell size of an optical black pixel is made smaller by far than the unit cell size of an effective pixel. Therefore, for example, when a solid-state image sensor is manufactured, the theoretical yield of chips can be increased, and also the area for the effective pixel area can be increased in proportion to the decreased area of the optical black area due to the downsizing of the unit cell size of the optical black pixel, which makes it possible to upgrade the sensitivity and the degree of integration.

Furthermore, an electrode opening port portion may not be formed in the optical black area at all, so that even if the transmission of light through a shielding film due to the trend of thinning the shielding film, the photoelectric conversion in the optical black area can be completely suppressed, which makes it possible to keep the reference black level constant. This is because there is no electrode opening port portion and naturally no light receiving portion.

In the above explanation, a CCD image sensor is used as an example for explanation; however, the present invention is not limited to this, and naturally the present invention can be applied to other solid-state image sensors a CMOS image sensor, etc.

What is claimed is:

1. A solid-state image sensor comprising:
   an effective pixel area having light receiving portions which perform photoelectric conversion a read gate, and a channel stopper; and
   an optical black area which generates a reference black level, said light receiving portions being formed inside electrode opening port portions which are formed through an electrode, wherein a width of said light receiving portions between said read gate and channel stopper in said optical black area is formed shorter than a width of said light receiving portions between said read gate and channel stopper in said effective pixel area.

2. A solid-state image sensor as claimed in claim 1, wherein said electrode is a transfer electrode.

3. A solid-state image sensor as claimed in claim 1, wherein said solid-state image sensor is a CCD image sensor.

4. A solid-state image sensor as claimed in claim 1, wherein said solid-state image sensor is a CMOS image sensor.

* * * * *